TRANSISTOR BLOCKING OSCILLATORS

Filed Aug. 18, 1951

2 Sheets-Sheet 1

INVENTOR
J. H. FELKER
BY H. A. Burgess
ATTORNEY

May 8, 1956 J. H. FELKER 2,745,012

TRANSISTOR BLOCKING OSCILLATORS

Filed Aug. 18, 1951 2 Sheets-Sheet 2

INVENTOR
J. H. FELKER
BY H. A. Burgess
ATTORNEY

United States Patent Office 2,745,012

Patented May 8, 1956

2,745,012

TRANSISTOR BLOCKING OSCILLATORS

Jean H. Felker, Livingston, N. J., assignor to Bell Telephone Laboratories, Incorporated, New York, N. Y., a corporation of New York Application August 18, 1951, Serial No. 242,442

5 Claims. (Cl. 250—36)

This invention relates generally to the generation and amplification of electrical pulses and more particularly to pulse generating or amplifying circuits employing transistors.

The principal object of the invention is to produce rectangular pulses at high recurrence rates and with extra short rise times.

Another object is to provide transistor pulse generating and amplifying circuits whose performance is substantially independent of the transistor characteristics.

In its principal aspect the present invention is a transistor blocking oscillator, in which the transistor output is coupled back to the input through an impedance changing transformer. A resistor is connected to bias the emitter electrode with respect to the base electrode, while a condenser is connected to by-pass the resistor. The biasing resistor is returned to a direct voltage source, the polarity of which is such as to bias the emitter electrode either in the forward direction or in the reverse direction, depending upon whether the blocking oscillator is to be free-running or is to operate only when triggered. In one embodiment of the invention, the transformer coupling is between the collector electrode and the base electrode, while in another it is between the collector and the emitter electrode.

A more thorough understanding of the invention may be obtained from a study of the following detailed description of several specific embodiments. In the drawings.

Because the transistor has a much lower input than output impedance, it is possible to design a transistor pulse generator in which the output is coupled back to the input through an impedance changing transformer. In its principal aspect, the present invention is a transistor blocking oscillator which makes use of such coupling and which will operate satisfactorily with practically any transistor. Rectangular pulses of less than a microsecond duration are easily generated and rise times as short as 0.01 microsecond have been obtained with 20 volt pulses. Pulse repetition rates from the low audio range up to two megacycles have been obtained. In addition, it is found that the negative resistance required for oscillation can be obtained even though the transistor current gain is less than unity.

Figure 1:
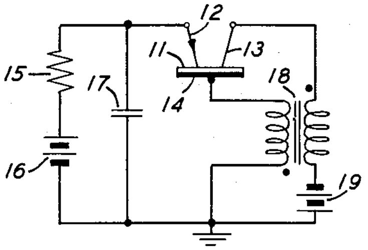
Fig. 1 is a schematic circuit diagram of a transistor blocking oscillator with transformer coupling between the collector and the base.
Figure 2:
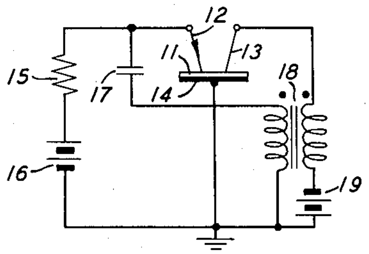
Fig. 2 is a similar diagram of a transistor blocking oscillator with transformer coupling between the collector and the emitter.

Basic circuits of two principal embodiments of the invention are shown in Figs. 1 and 2. In Fig. 1, the transistor comprises a semiconductive body 11, an emitter electrode 12, a collector electrode 13, and a base electrode 14, the emitter being biased with respect to the base by a resistor 15. One end of resistor 15 is connected to the emitter and a biasing battery 16 is connected between the other end and ground. A low impedance path for alternating current from the emitter to ground is provided by a by-pass condenser 17. The low potential winding of an impedance changing transformer 18 is connected between the base and ground, while the high potential winding has one end connected to the collector. A collector battery 19 is connected between the other end of the high potential winding and ground.

Battery 19 is polled to bias the collector in the reverse direction and battery 16 is poled to bias the emitter in either the forward or the reverse direction, depending upon whether the blocking oscillator is to be free-running or is to operate only when triggered. Transformer 18 is connected with the polarity of its windings opposite, so that it will couple an inverted collector pulse back to the base at an impedance level comparable to the base impedance.

In many respects, the embodiment of the invention shown in Fig. 1 operates much like the vacuum tube equivalent. During the "on" period, the collector voltage is nearly at ground, the base is held negative by pulse transformer 18, and the emitter condenser 17 is charged negatively by the emitter current to a voltage nearly equal to the base voltage. During the "off" period, the collector voltage is negative, the base is at ground potential, and the charge level on condenser 17 holds the emitter at a negative potential.

For purposes of a more detailed discussion, it may be assumed that the emitter condenser 17 has been charged negatively and is discharging through resistor 15 towards a positive voltage. Until the emitter reaches ground potential, the transistor is cut off. When ground potential is reached, emitter current begins to flow, releasing holes to the collector. The collector current causes the collector potential to rise, and transmission through the inverting transformer 18 causes the base to fall in potential, which increases the emitter current. This regenerative transition from low emitter current to high current may occur in from one-hundredth of a microsecond to several tenths of a microsecond, depending upon the characteristics of the transistor.

During the transition the emitter current is charging condenser 17 negatively, but as the condenser charges the emitter current decreases because the emitter becomes less positive with respect to the base. At the same time that the emitter current is falling, the collector current required in the transformer to maintain the negative pulse at the base increases because of the low frequency cutoff or time constant of the transformer. When the emitter current has fallen where it no longer releases the holes necessary to supply the demanded collector current, the base voltage rises towards ground. This causes a further decrease in the emitter current, and the transistor regeneratively cuts itself off. Condenser 17 is left at a negative potential and begins again to discharge through resistor 15 towards ground.

The above discussion has proceeded upon the tacit assumption that the emitter is biased in the forward direction by battery 16, and that the body of the transistor is n-type semiconductive material. Under such conditions, the oscillator is free-running and battery 16 supplies a positive potential to the emitter. Battery 19, on the other hand, supplies a negative potential to the collector. If the circuit is to operate only when triggered, the emitter is biased in the reverse or blocking direction. In that case, the polarity of collector battery 19 remains the same but that of battery 16 is reversed, so that a negative potential is supplied to the emitter. When the body of the transistor is p-type semiconductive material, the polarities of batteries 16 and 19 are reversed from those used for n-type material, both for operation as a free-running oscillator and when the circuit is to operate only when triggered.

The above discussion shows that the recurrence rate of the blocking oscillator shown in Fig. 1 is determined by the size of condenser 17 and by the current supplied through resistor 15. The pulse duration is determined primarily by the transformer 18 and the condenser 17, and only in part by the characteristics of the transistor.

The other principal embodiment of the invention is shown in Fig. 2, which is like Fig. 1 except that the collector voltage is fed back in phase to the emitter, rather than reversed in phase to the base. The windings of transformer 18 are not reversed in phase and the low potential winding is connected between condenser 17 and ground, while the transistor base is connected directly to ground. The operation of the circuit as shown in Fig. 2 is similar to that of the one shown in Fig. 1, the principal difference being that a pulse in transformer 18 causes the emitter to rise in potential rather than the base to fall in potential. The polarities of batteries 16 and 19 are determined in the same manner as for the circuit shown in Fig. 1, the significant factors again being whether or not the oscillator is to be free-running and whether the body of the transistor is n-type or p-type material. In both Figs. 1 and 2, the useful output of the circuit may be taken from the high potential winding of transformer 18.

Figure 3:
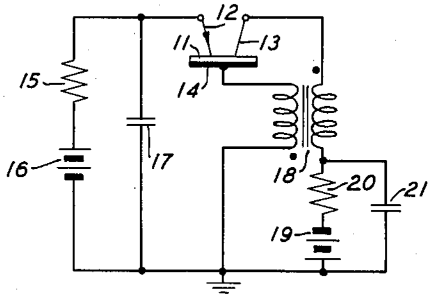
Fig. 3 is a more detailed drawing of a transistor blocking oscillator of the type shown in Fig. 1.

A more refined variation of the embodiment of the invention shown in Fig. 1 appears in Fig. 3. The circuit is the same except that a resistor 20 has been added in series between the high potential winding of transformer 18 and collector battery 19. A by-pass condenser 21 is connected from the junction between the high potential winding and resistor 20 and ground. For a free-running oscillator and an n-type transistor body, the following representative values of the respective circuit elements may be used:

| | |
|---|---|
| Resistor **15** | 68,000 ohms. |
| Battery **16** | +60 volts. |
| Condenser **17** | 6800 micromicrofarads. |
| Transformer **18** | Turns ratio of 50:9. |
| Battery **19** | −45 volts. |
| Resistor **20** | 3,000 ohms. |
| Condenser **21** | 0.25 microfarad. |

Figure 4A:
Figs. 4A, 4B, 4C and 4D show typical transistor blocking oscillator wave forms.
Figure 4B:
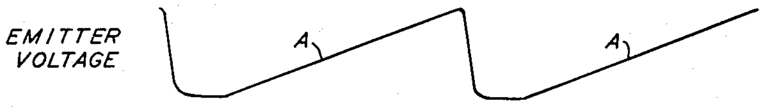
Figure 4C:
Figure 4D:
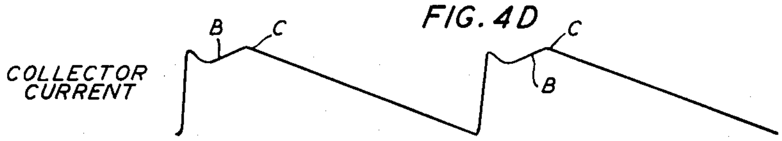

Some of the wave forms appearing in the circuit of Fig. 3 are shown in Figs. 4A, 4B, 4C, and 4D. Two complete cycles are shown in each figure and all figures are drawn to the same time scale. In order to show two complete cycles, the time scale has been foreshortened somewhat for the periods between pulses. The collector voltage wave form is shown in Fig. 4A and represents the useful output of the oscillator. Each voltage pulse is approximately 18 volts in amplitude and is approximately two microseconds in duration. The time between pulses is approximately 20 microseconds. The emitter voltage wave form is shown in Fig. 4B. The peak emitter voltage is three volts and "A" designates the portion of the cycle where condenser 17 is discharging at a rate of 0.15 volt per microsecond. The emitter current wave form is shown in Fig. 4C, where the maximum emitter current is 65 milliamperes. The collector current wave form appears in Fig. 4D where the maximum collector current is 15 milliamperes. In Fig. 4D, "B" indicates the portion of the cycle where the collector current is increasing because the low frequency cut-off of transformer 18 requires greater current for the same voltage and "C" indicates the point where the emitter current is no longer large enough to maintain the collector current.

Figure 5:
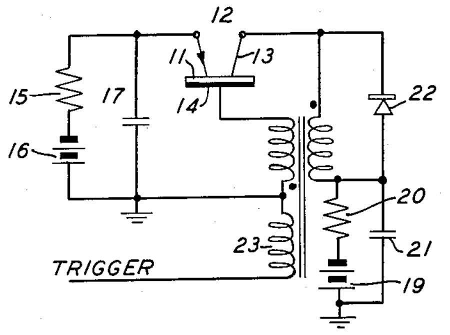
Figs. 5 and 6 are schematic circuit diagrams of regenerative pulse amplifiers embodying the present invention.
Figure 6:
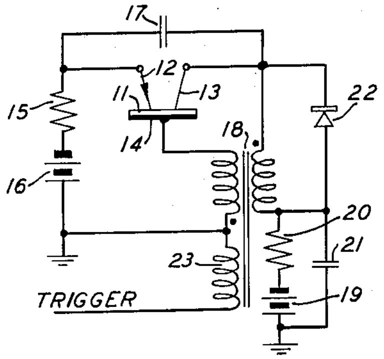

Further variations of the embodiment of the invention shown in Fig. 1 are illustrated in Figs. 5 and 6. In these circuits, the emitter is biased in a reverse or blocking direction and pulses are generated only when the circuits are triggered. The circuits may thus be operated as regenerative pulse amplifiers to generate short rectangular pulses under the control of incoming pulses. The circuit shown in Fig. 5 is similar to the basic circuit of Fig. 1 but has, in addition, the resistor 20 and the condenser 21 of Fig. 3. Further, a crystal rectifier 22 is connected across the collector winding of transformer 18 to clip the negative tail that occurs at the end of each pulse when the transformer is not fully loaded and an auxiliary winding 23 is provided for transformer 18. The auxiliary winding is, by way of example, wound on the same core as the other windings and is connected between the source of trigger pulses and ground. For an n-type transistor body, the following values of the respective circuit elements may be used:

| | |
|---|---|
| Resistor **15** | 910,000 ohms. |
| Battery **16** | −45 volts. |
| Condenser **17** | 500 micromicrofarads. |
| Transformer **18** | Turns ratio of 36:9. |
| Battery **19** | −45 volts. |
| Resistor **20** | 3,000 ohms. |
| Condenser **21** | 0.25 microfarad. |

The circuit shown in Fig. 6 is similar to that shown in Fig. 5, with the exception that condenser 17 is returned from the emitter to the collector rather than to ground. The operation is substantially the same as that of the circuits shown in Fig. 5 and similar values of circuit elements may be used.

The recurrence rate of a free-running blocking oscillator embodying the present invention may be calculated from a simple relation if the emitter resistor is returned to a large voltage $E_e$ (positive for an n-type transistor body), so that a constant current is supplied to the emitter. In Figs. 1 and 2, $E_e$ would be the voltage of battery 16. If the emitter swing during each pulse is $\Delta E_e$, the recurrence rate will be $$f_r = \frac{1}{\frac{\Delta E_e}{E_e} RC + \tau} \qquad (1)$$

where $\tau$ is the pulse duration, R is the resistance of resistor 16, and C is the capacity of condenser 17. The emitter swing is equal to the base swing and is given approximately by $$\Delta E_e = \frac{\Delta E_c}{N} \qquad (2)$$

where $\Delta E_c$ is the collector swing and N is the transformer turns ratio. If the collector winding is returned to a battery of $E_c$ volts, and N is three or more, the swing in collector voltage will almost equal the battery voltage and will be very stable. A close approximation of the recurrence rate is, therefore, given by $$f_r \approx \frac{1}{\frac{E_c}{E_e} \frac{RC}{N} + \tau} \qquad (3)$$

Figure 7:
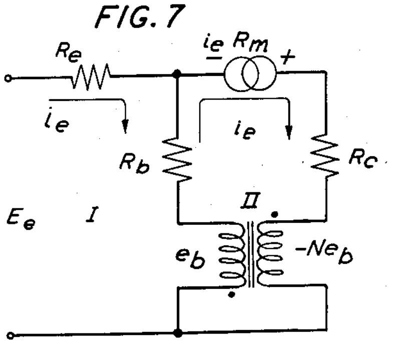
Fig. 7 shows the equivalent circuit of a transistor blocking oscillator of the type shown in Fig. 1.

An equivalent circuit of the basic transistor blocking oscillator of Fig. 1 is shown in Fig. 7. $R_e$, $R_c$, and $R_b$ indicate the emitter, collector, and base impedances, respectively, of the transistor, and $R_m$ designates the mutual impedance. The emitter current and the collector current are designated by $i_e$ and $i_c$, respectively, while the voltage across the low potential winding of the transformer is designated by $e_b$.

Analysis of the impedance $R_i$ shown at the emitter of the blocking oscillator shows a negative resistance of the series type, the magnitude of which may be taken as some evidence of the performance of the circuit as an oscillator. Assuming that the transformer is ideal and is inverting with a turns ratio N, the following equations may be written with reference to Fig. 7. In mesh I $$i_e(R_e+R_b)-i_cR_b=E_e-e_b \quad (4)$$

and in mesh II $$-i_e(R_b+R_m)+i_c(R_b+R_c)=e_b(N+1) \quad (5)$$

Since the transformer is assumed to be ideal $$i_c=\frac{i_e-i_c}{N} \quad (6)$$

$$i_c=\frac{i_e}{N+1} \quad (7)$$

Substituting (7) in (4) and (5) gives $$-i_e\left(R_e+\frac{N}{N+1}R_b\right)+e_b=E_e \quad (8)$$

and $$-i_e\left(R_m-\frac{R_c}{N+1}+\frac{R_bN}{N+1}\right)-e_b(N+1)=0 \quad (9)$$

which can be solved for $$\frac{E_e}{i}=R_i=-\frac{R_m}{N+1}+\frac{R_c}{(N+1)^2}+R_b\left(\frac{N}{N+1}\right)^2+R_e \quad (10)$$

which shows that a negative resistance can be obtained when $R_m$ is less than $R_c$. This permits pulses to be generated with transistors whose current gain is less than one.

Pulse generating and amplifying circuits embodying the present invention are stable and are nearly independent of the transistor characteristics. In addition to the more obvious applications, circuits employing the invention can be used as frequency dividing devices because of their stability and their circuit-controlled recurrence frequency. Since they can be operated at a megacycle rate, they are useful wherever fast powerful pulses are required.

It is to be understood that the above-described arrangements are illustrative of the application of the principles of the invention. Numerous other arrangements may be devised by those skilled in the art without departing from the spirit and scope of the invention.

What is claimed is:

1. A pulse generator which comprises a transistor having an emitter electrode, a collector electrode, and a base electrode, a transformer intercoupling said collector electrode with one of the other of said electrodes to provide positive feedback, means to bias said collector electrode in the reverse direction, a timing capacitor, a charging path for said timing capacitor which includes the internal path of said transistor between said emitter and base electrodes, biasing means for said emitter electrode, and a discharge path for said timing capacitor which includes a resistor connected between said emitter and base electrodes, said timing capacitor being alternately charged and discharged through said respective paths in order to provide sharp pulses of output voltage at said collector electrode.

2. A pulse generator which comprises a transistor having an emitter electrode, a collector electrode, and a base electrode, an impedance-changing transformer inverting the voltage at said collector electrode and coupling it back to said base electrode at an impedance level substantially equal to the transistor base impedance, means to bias said collector electrode in the reverse direction, a timing capacitor, a charging path for said timing capacitor which includes the internal path of said transistor between said emitter and base electrodes, biasing means for said emitter electrode, and a discharge path for said timing capacitor which includes a resistor connected between said emitter and base electrodes, said timing capacitor being alternately charged and discharged through said respective paths in order to provide sharp pulses of output voltage at said collector electrodes.

3. A pulse generator which comprises a transistor having an emitter electrode, a collector electrode, and a base electrode, an impedance-changing transformer transferring the voltage at said collector electrode back in phase to said emitter electrode at an impedance level substantially equal to the transistor emitter impedance, means to bias said collector electrode in the reverse direction, a timing capacitor, a charging path for said timing capacitor which includes the internal path of said transistor between said emitter and base electrodes, biasing means for said emitter electrode, and a discharge path for said timing capacitor which includes a resistor connected between said emitter and base electrodes, said timing capacitor being alternately charged and discharged through said respective paths in order to provide sharp pulses of output voltage at said collector electrode.

4. A free-running pulse generator which comprises a transistor having an emitter electrode, a collector electrode, and a base electrode, an impedance-changing transformer coupling the voltage at said collector electrode back to one of the other of said electrodes at an impedance level substantially equal to the transistor impedance associated with the other said electrode, means to bias said collector electrode in the reverse direction, a timing capacitor, a charging path for said timing capacitor which includes the internal path of said transistor between said emitter and base electrodes, means to bias said emitter electrode in the forward direction, and a discharge path for said timing capacitor which includes a resistor connected between said emitter and base electrodes, said timing capacitor being alternately charged and discharged through said respective paths in order to provide a regular succession of sharp pulses of output voltage at said collector electrode at a recurrence rate substantially independent of the characteristics of said transistor.

5. A regenerative pulse amplifier which comprises a transistor having an emitter electrode, a collector electrode, and a base electrode, an impedance-changing transformer coupling the voltage at said collector electrode back to one of the other of said electrodes at an impedance level substantially equal to the transistor impedance associated with the other said electrode, an auxiliary winding for said transformer, means to bias said collector electrode in the reverse direction, a timing capacitor, a charging path for said timing capacitor which includes the internal path of said transistor between said emitter and base electrodes, means to bias said emitter electrode in the reverse direction, and a discharge path for said timing capacitor which includes a resistor connected between said emitter and base electrodes, said timing capacitor being alternately charged and discharged through said respective paths in order to provide a sharp pulse of output voltage at said collector electrode whenever a pulse is impressed upon said auxiliary winding.

References Cited in the file of this patent

UNITED STATES PATENTS

| | | |
|---|---|---|
| 1,913,449 | Kobayashi | June 13, 1933 |
| 2,211,852 | Geiger | Aug. 20, 1940 |
| 2,486,776 | Barney | Nov. 1, 1949 |
| 2,556,286 | Meacham | June 12, 1951 |
| 2,586,597 | Bardeen et al. | Feb. 19, 1952 |
| 2,647,957 | Mallinckrodt | Aug. 4, 1953 |

OTHER REFERENCES

Article: "The Transistor A Crystal Triode" from Electronics, September 1948, pages 68 to 71.

Article: "Eclipse of the Radio Tube" from Radio Craft, September 1948, pages 24 and 25.